United States Patent
Yoshihara et al.

(10) Patent No.: US 8,940,649 B2
(45) Date of Patent: Jan. 27, 2015

(54) COATING TREATMENT METHOD, NON-TRANSITORY COMPUTER STORAGE MEDIUM AND COATING TREATMENT APPARATUS

(75) Inventors: Kousuke Yoshihara, Koshi (JP); Shinichi Hatakeyama, Koshi (JP)

(73) Assignee: Tokyo Electron Limited, Tokyo (JP)

(*) Notice: Subject to any disclaimer, the term of this patent is extended or adjusted under 35 U.S.C. 154(b) by 521 days.

(21) Appl. No.: 13/181,565

(22) Filed: Jul. 13, 2011

(65) Prior Publication Data

US 2012/0021611 A1  Jan. 26, 2012

(30) Foreign Application Priority Data

Jul. 23, 2010  (JP) .................................. 2010-166243

(51) Int. Cl.
  *H01L 21/469*  (2006.01)
  *H01L 21/67*  (2006.01)
(52) U.S. Cl.
  CPC .................................. *H01L 21/6715* (2013.01)
  USPC ........................................................ 438/782
(58) Field of Classification Search
  None
  See application file for complete search history.

(56) References Cited

U.S. PATENT DOCUMENTS

| 4,518,678 A * | 5/1985 | Allen ............................. 430/311 |
| 2008/0057194 A1 * | 3/2008 | Tanaka ........................... 427/240 |
| 2008/0069948 A1 | 3/2008 | Yoshihara et al. |
| 2009/0226615 A1 * | 9/2009 | Nakazawa ..................... 427/256 |
| 2010/0003403 A1 * | 1/2010 | Huang et al. .................. 427/240 |
| 2011/0052807 A1 * | 3/2011 | Ichino et al. .................. 427/240 |

FOREIGN PATENT DOCUMENTS

| JP | 63-128628 A | 6/1988 |
| JP | A-2006-156565 | 6/2006 |
| JP | A-2008-060462 | 3/2008 |
| JP | A-2008-71960 | 3/2008 |
| JP | A-2008-124369 | 5/2008 |
| JP | A-2008-251810 | 10/2008 |

* cited by examiner

*Primary Examiner* — Charles Garber
*Assistant Examiner* — Andre' C Stevenson
(74) *Attorney, Agent, or Firm* — Posz Law Group, PLC

(57) ABSTRACT

A coating treatment method includes: a first step of rotating a substrate at a first rotation number; a second step of rotating the substrate at a second rotation number being slower than the first rotation number; a third step of rotating the substrate at a third rotation number being faster than the second rotation number and slower than the first rotation number; a fourth step of rotating the substrate at a fourth rotation number being slower than the third rotation number; and a fifth step of rotating the substrate at a fifth rotation number being faster than the fourth rotation number. A supply of a coating solution to a central portion of the substrate is continuously performed from the first step to a middle of the second step or during the first step, and the fourth rotation number is more than 0 rpm and 500 rpm or less.

14 Claims, 17 Drawing Sheets

COATING TREATMENT METHOD, NON-TRANSITORY COMPUTER STORAGE MEDIUM AND COATING TREATMENT APPARATUS

BACKGROUND OF THE INVENTION

1. Field of the Invention

The present invention relates to a coating treatment method, a non-transitory computer storage medium and a coating treatment apparatus coating a coating solution onto a substrate.

2. Description of the Related Art

In a photolithography process in a manufacturing process of a semiconductor device, for example, a resist coating treatment of coating a resist solution onto a semiconductor wafer (hereinafter, referred to as a "wafer") to form a resist film, exposure processing of exposing the resist film to a predetermined pattern, a developing treatment of developing the exposed resist film and so on are performed in sequence to form a predetermined resist pattern on the wafer.

In the above-described resist coating treatment, a so-called spin coating method is frequently used in which a resist solution is supplied from a nozzle to a central portion of the rotating wafer and a centrifugal force is utilized to diffuse the resist solution over the wafer to thereby coat the resist solution on the wafer. It is necessary to coat the resist solution on the wafer with high in-plane uniformity when the resist coating as stated above is performed. Besides, it is also important in this spin coating method to reduce a supply amount of the resist solution on the wafer because a most part of the resist solution supplied on the wafer is spun off and the resist solution is expensive.

A coating treatment method executing a first step to a third step stated below is proposed as a method of uniformly coating the resist solution with a small amount in the spin coating method as stated above. At first, in the first step, the resist solution is supplied to the central portion of the wafer rotating at high speed at a first rotation number to diffuse the resist solution on the wafer. In this first step, the amount of the resist solution supplied on the wafer is small, and therefore the resist solution does not diffuse to an end of the wafer. Subsequently, in the second step, the number of rotations of the wafer is once decelerated to a second rotation number, and the supply of the resist solution in the first step is continued so as to improve fluidity of the resist solution on the wafer. After that, in the third step, the rotation of the wafer is accelerated to a third rotation number to diffuse the resist solution to a whole surface of the wafer, and perform drying of the diffused resist solution, and the resist solution with a uniform film thickness is coated on the wafer, after the supply of the resist solution in the second step is stopped (Japanese Patent Application Laid-open No. 2008-71960).

SUMMARY OF THE INVENTION

However, it turned out that the in-plane uniformity deteriorates if the supply amount of the resist solutions is further reduced, and in particular, lowering of the film thickness of the resist solution at an outer peripheral edge portion of the substrate becomes obvious even in a case when the above-stated conventional method is used according to the present inventors. According to a verification by the present inventors as for the above-stated problem, for example, the supplied resist solutions is necessary to be approximately 0.5 ml (milliliter) when a diameter of the wafer is 300 mm to uniformly coat the resist solution to an end portion of the wafer by using the above-stated method, and the lowering of the film thickness of the resist solution at the outer peripheral edge portion can be seen when the amount of the supplied resist solution is set to be, for example, 0.25 ml which is a half of a required amount. Accordingly, there has been a limit in the supply amount of the resist solution which can be reduced to uniformly coat the resist solution within the wafer surface in the conventional method, and it is impossible to suppress less than a predetermined value.

The present invention is made to address to the above-stated problems, and an object thereof is to uniformly coat a coating solution within a substrate surface while suppressing a supply amount of the coating solution to a small amount when the coating solution is coated on the substrate.

To attain the above stated object, a coating treatment method coating a coating solution onto a substrate, includes: a first step of rotating the substrate at a first rotation number; a second step of subsequently decelerating the rotation of the substrate, and rotating the substrate at a second rotation number which is slower than the first rotation number; a third step of subsequently accelerating the rotation of the substrate, and rotating the substrate at a third rotation number which is faster than the second rotation number and slower than the first rotation number; a fourth step of subsequently decelerating the rotation of the substrate, and rotating the substrate at a fourth rotation number which is slower than the third rotation number; and a fifth step of subsequently accelerating the rotation of the substrate, and rotating the substrate at a fifth rotation number which is faster than the fourth rotation number, wherein a supply of the coating solution to a central portion of the substrate is continuously performed from the first step to a middle of the second step or during the first step, and the fourth rotation number is more than "0" (zero) rpm and 500 rpm or less.

It is verified that lowering of a film thickness of a resist solution at an outer peripheral edge portion occurs when a supply amount of the resist solution is set to be approximately half of a conventional method, because a drying proceeds while the resist solution diffuses toward an outer periphery of the substrate in the third step, fluidity deteriorates, and the resist solution dries as it is even if the resist solution reaches an end portion of the outer periphery of the substrate as a result of a hard study of the inventors.

It turned out by the further study of the inventors that the number of rotations of the substrate is decelerated when the resist solution reaches the substrate end portion in the third step, and the substrate is rotated at more than "0" (zero) rpm and 500 rpm or less which is slower than the third rotation number, and thereby it becomes possible to diffuse the resist solution at the central portion of the substrate toward the outer periphery of the substrate while suppressing the drying of the resist solution, namely, to adjust a balance of the film thickness between the central portion of the substrate and the outer peripheral portion of the substrate within the substrate surface. Accordingly, it turned out that it is possible to coat the coating solution without causing the lowering of the film thickness of the resist solution at the outer peripheral edge portion and to uniformly coat the coating solution within the substrate surface even when the supply amount of the resist solution is suppressed to a small amount than the conventional method by rotating the substrate at the third rotation number, and then it is rotated at the fourth rotation number after the resist solution reaches the end portion of the substrate.

Accordingly, in the present invention, at first, the coating solution is supplied to the central portion of the substrate while rotating the substrate at the first rotation number in the first step, and therefore the coating solution can be uniformly diffused even when the supply amount of the coating solution to the substrate is small. After that, the substrate is rotated at the second rotation number in the second step, and therefore the coating solution supplied in the first step is diffused on the substrate while suppressing the drying thereof. Subsequently, the substrate is rotated at the third rotation number which is faster than the second rotation number and slower than the first rotation number in the third step, and therefore the coating solution on the substrate is diffused to a whole surface of the substrate. In the subsequent fourth step, the substrate is rotated at the fourth rotation number which is slower than the third rotation number, and therefore the resist solution at the central portion of the substrate is diffused toward the outer periphery of the substrate while suppressing the drying of the resist solution and the coating solution on the substrate is smoothed and planarized. As stated above, according to the coating treatment method of the present invention, it is possible to uniformly coat the coating solution within the substrate surface while suppressing the supply amount of the coating solution to a small amount.

The present invention according to another aspect is a non-transitory computer readable storage medium storing a computer program operating on a computer at a control unit controlling a coating treatment apparatus to execute a coating treatment method at the coating treatment apparatus, wherein the coating treatment method includes: a first step of rotating a substrate at a first rotation number; a second step of subsequently decelerating the rotation of the substrate, and rotating the substrate at a second rotation number which is slower than the first rotation number; a third step of subsequently accelerating the rotation of the substrate, and rotating the substrate at a third rotation number which is faster than the second rotation number and slower than the first rotation number; a fourth step of subsequently decelerating the rotation of the substrate, and rotating the substrate at a fourth rotation number which is slower than the third rotation number; and a fifth step of subsequently accelerating the rotation of the substrate, and rotating the substrate at a fifth rotation number which is faster than the fourth rotation number, wherein a supply of the coating solution to a central portion of the substrate is continuously performed from the first step to a middle of the second step or during the first step, and the fourth rotation number is more than "0" (zero) rpm and 500 rpm or less.

Further, the present invention according to another aspect is a coating treatment apparatus coating a coating solution onto a substrate, includes: a rotation holding unit holding and rotating the substrate; a coating solution nozzle supplying the coating solution to the substrate; and a control unit controlling the rotation holding unit to execute: a first step of rotating the substrate at a first rotation number; a second step of subsequently decelerating the rotation of the substrate, and rotating the substrate at a second rotation number which is slower than the first rotation number; a third step of subsequently accelerating the rotation of the substrate, and rotating the substrate at a third rotation number which is faster than the second rotation number and slower than the first rotation number; a fourth step of subsequently decelerating the rotation of the substrate, and rotating the substrate at a fourth rotation number of more than "0" (zero) rpm and 500 rpm or less which is slower than the third rotation number; and a fifth step of subsequently accelerating the rotation of the substrate, and rotating the substrate at a fifth rotation number which is faster than the fourth rotation number, and controlling the coating solution nozzle to continuously perform a supply of the coating solution to a central portion of the substrate from the first step to a middle of the second step or during the first step.

According to the present invention, it is possible to uniformly coat a coating solution within a substrate surface while suppressing a supply amount of the coating solution to a small amount when the coating solution is coated on the substrate.

DETAILED DESCRIPTION OF THE INVENTION

Figure 1:
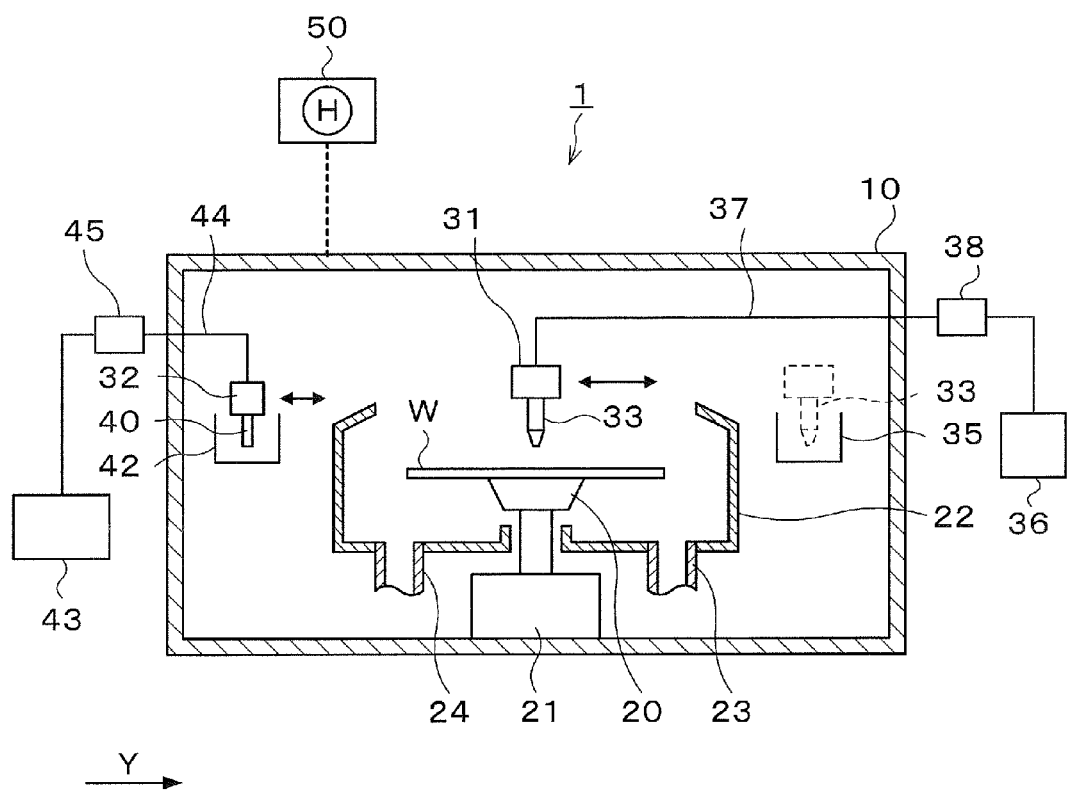
FIG. 1 is a longitudinal sectional view illustrating an outline of a configuration of a resist coating apparatus according to an embodiment.
Figure 2:
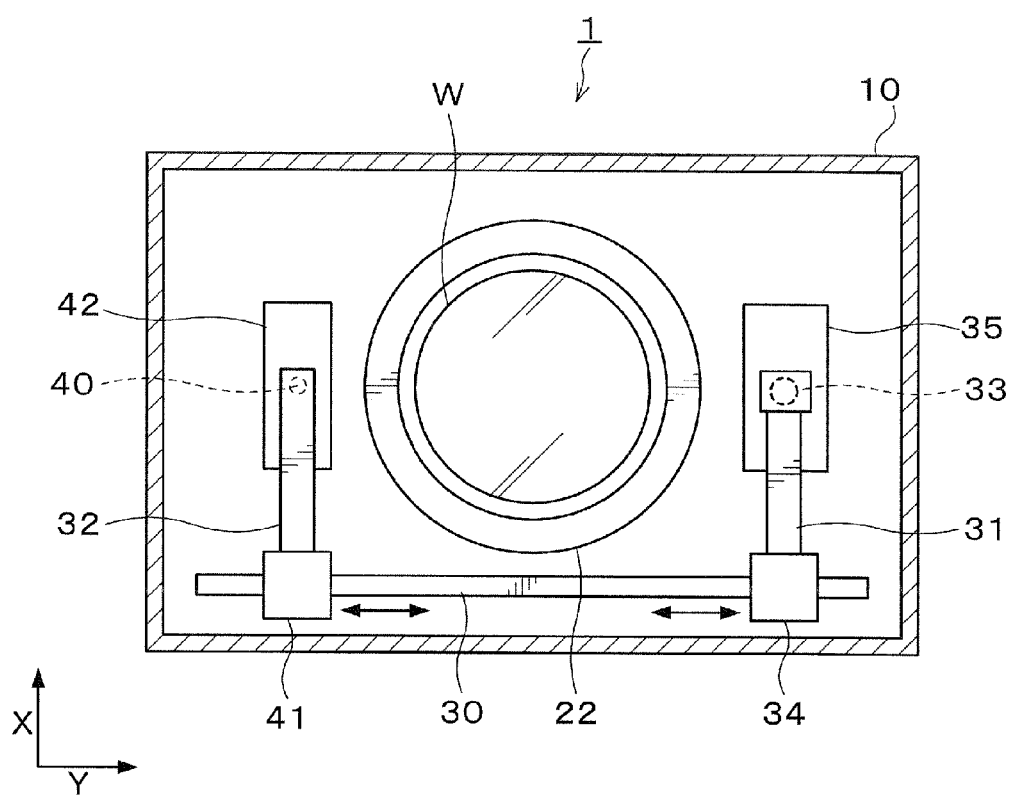
FIG. 2 is a transverse sectional view illustrating the outline of the configuration of the resist coating apparatus according to the embodiment.

Hereinafter, embodiments of the present invention are described. FIG. 1 is a longitudinal sectional view illustrating an outline of a configuration of a resist coating apparatus 1 as a coating treatment apparatus according to an embodiment. FIG. 2 is a transverse sectional view illustrating the outline of the configuration of the resist coating apparatus 1. Note that in the present embodiment, a resist solution is used as a coating solution. Besides, a diameter of a wafer W used as a substrate is 300 mm in the present embodiment.

The resist coating apparatus 1 has a treatment container 10 as illustrated in FIG. 1. A spin chuck 20 as a rotating and holding unit which holds and rotates the wafer W thereon is provided at a central portion in the treatment container 10. The spin chuck 20 has a horizontal upper surface, and the upper surface is provided with, for example, a suction port (not illustrated) which sucks the wafer W. Suction through the suction port allows the wafer W to be suction-held on the spin chuck 20.

The spin chuck 20 has a chuck drive mechanism 21 equipped with, for example, a motor or the like and can be rotated at a predetermined speed by the chuck drive mechanism 21. Further, the chuck drive mechanism 21 is provided with a raising and lowering drive source such as a cylinder so that the spin chuck 20 is vertically movable.

Around the spin chuck 20, a cup 22 is provided which receives and collects liquid splashing or dropping from the wafer W. A drain pipe 23 for draining the collected liquid and an exhaust pipe 24 for exhausting an atmosphere in the cup 22 are connected to a bottom surface of the cup 22.

As illustrated in FIG. 2, on a side of a negative direction in an X-direction (a lower direction in FIG. 2) of the cup 22, a rail 30 is formed which extends along a Y-direction (a right-to-left direction in FIG. 2). The rail 30 is formed, for example, from an outside on a negative direction side in the Y-direction of the cup 22 (the left direction in FIG. 2) to an outside on a positive direction side in the Y-direction (the right direction in FIG. 2). To the rail 30, for example, two arms 31 and 32 are attached.

On the first arm 31, a resist solution nozzle 33 as a coating solution nozzle which supplies a resist solution on the wafer W is supported as illustrated in FIG. 1 and FIG. 2. The first arm 31 is movable on the rail 30 by means of a nozzle drive unit 34 illustrated in FIG. 2. This allows the resist solution nozzle 33 to move from a waiting section 35 provided at the outside on the positive direction side in the Y-direction of the cup 22 to a position above a central portion of the wafer W in the cup 22 and further move in a direction of the diameter of the wafer W above a surface of the wafer W. The first arm 31 freely rises and lowers by means of the nozzle drive unit 34 to be able to adjust a height of the resist solution nozzle 33.

To the resist solution nozzle 33, a supply pipe 37 communicating with a resist solution supply source 36 is connected as illustrated in FIG. 1. In the resist solution supply source 36, the resist solution is stored. The supply pipe 37 is provided with a supply equipment group 38 including a valve for controlling a flow of the resist solution, a flow regulator and so on.

On the second arm 32, a solvent nozzle 40 is supported which supplies a solvent of the resist solution, for example, thinner. The second arm 32 is movable on the rail 30 by means of a nozzle drive unit 41 illustrated in FIG. 2 and can move the solvent nozzle 40 from a waiting section 42 provided at an outside on the negative direction side in the Y-direction of the cup 22 to the position above the central portion of the wafer W in the cup 22. The second arm 32 freely rises and lowers by means of the nozzle drive unit 41 to be able to adjust the height of the solvent nozzle 40.

To the solvent nozzle 40, a supply pipe 44 communicating with a solvent supply source 43 is connected as illustrated in FIG. 1. In the solvent supply source 43, solvent is stored. The supply pipe 44 is provided with a supply equipment group 45 including a valve for controlling a flow of the solvent, a flow regulator and so on. Note that though the resist solution nozzle 33 for supplying the resist solution and the solvent nozzle 40 for supplying the solvent are supported on separate arms in the above configuration, they may be supported on the same arm, and movement and supply timings of the resist solution nozzle 33 and the solvent nozzle 40 may be controlled by control of the movement of the arm.

Operations of a drive system such as the above-described rotation operation and vertical operation of the spin chuck 20, the movement operation of the resist solution nozzle 33 by the nozzle drive unit 34, the supply operation of the resist solution of the resist solution nozzle 33 by the supply equipment group 38, the movement operation of the solvent nozzle 40 by the nozzle drive unit 41, the supply operation of the solvent of the solvent nozzle 40 by the supply equipment group 45 and so on are controlled by a control unit 50. The control unit 50 is made up of, for example, a computer including a CPU, a memory, and so on, and enables a resist coating treatment in the resist coating apparatus 1, for example, by executing programs stored in the memory. Note that programs which are stored, for example, on a storage medium H such as a computer-readable hard disk (HD), flexible disk (FD), compact disk (CD), magneto-optical disk (MO), or a memory card, and installed from the storage medium H into the control unit 50 are used as various programs used to enable the resist coating treatment in the resist coating apparatus 1.

Figure 3:
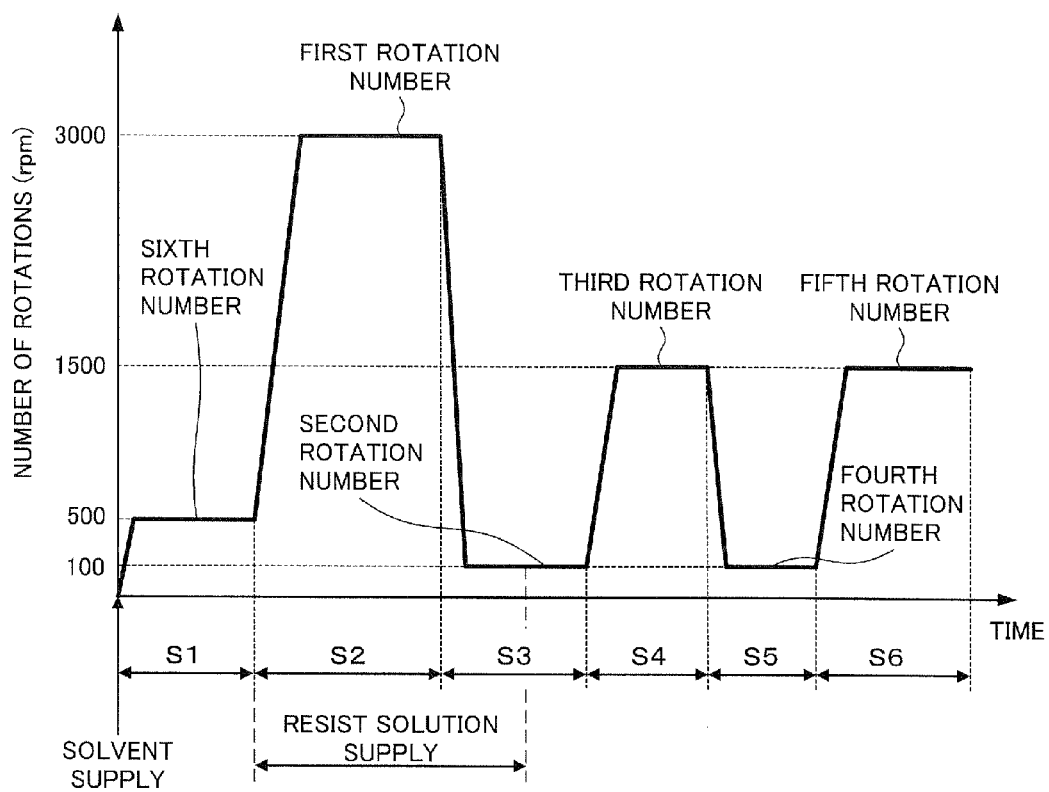
FIG. 3 is a graph illustrating the number of rotations of a wafer and supply timings of a resist solution and a solvent in each step of a coating treatment process.
Figure 4A:
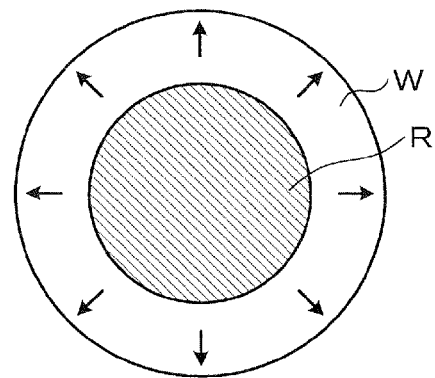
FIG. 4A is an explanatory view illustrating an appearance in which the resist solution diffuses on a wafer rotating at a first rotation number.
Figure 4B:
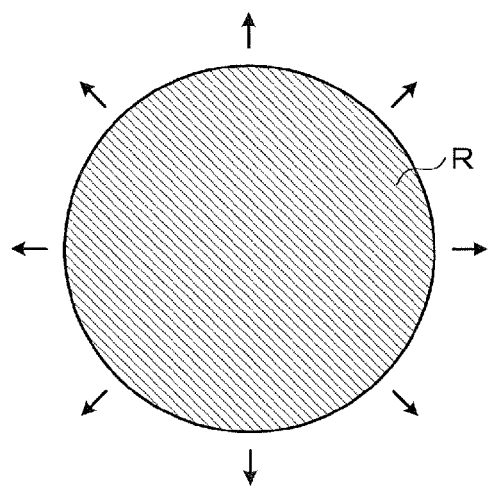
FIG. 4B is an explanatory view illustrating an appearance in which the resist solution diffuses on the wafer rotating at a third rotation number.
Figure 4C:
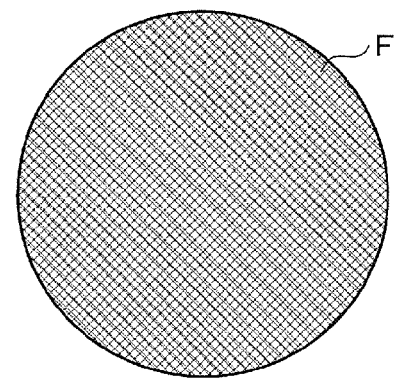
FIG. 4C is an explanatory view illustrating an appearance in which a resist film is formed on the wafer.

Next, the coating treatment process performed in the resist coating apparatus 1 constituted as described above will be described. FIG. 3 is a graph illustrating the number of rotations of the wafer W and the supply timings of the resist solution and the solvent in each step of the coating treatment process. FIG. 4A to FIG. 4C schematically illustrate a state of a liquid film on the wafer W in main steps of the coating treatment process. Note that a length of time of the process in FIG. 3 does not necessarily correspond to an actual length of time for easy understanding of technique.

The wafer W transferred in the resist coating apparatus 1 is first suction-held on the spin chuck 20. Subsequently, the solvent nozzle 40 at the waiting section 42 is moved by the second arm 32 to the position above the central portion of the wafer W. Then, a predetermined amount of solvent is supplied from the solvent nozzle 40 to the central portion of the wafer W under a state in which the wafer W is stopped as illustrated in FIG. 3. After that, the chuck drive mechanism 21 is controlled to cause the spin chuck 20 to rotate the wafer W, and the number of rotations thereof is increased to, for example, 500 rpm which is a sixth rotation number. The wafer W is rotated at the number of rotations of 500 rpm for, for example, one second, and thereby the solvent supplied to the central portion of the wafer W diffuses toward an outer peripheral portion, namely, prewetting is performed, and thereby the surface of the wafer W becomes a state wet by the solvent (Step S1 in FIG. 3). After that, the solvent nozzle 40 moves from the position above the central portion of the wafer W, and the resist solution nozzle 33 at the waiting section 35 moves to the position above the central portion of the wafer W by the first arm 31, when the solvent diffuses to a whole surface of the wafer W.

Subsequently, the rotation of the wafer W is accelerated to, for example, 2000 rpm to 3500 rpm which is a first rotation number, 3000 rpm in this embodiment as illustrated in FIG. 3, and thereafter the wafer W is rotated at the first rotation number for, for example, 0.8 seconds. During the accelerating rotation of the wafer W and during the rotation at the first rotation number, a resist solution R is continuously supplied from the resist solution nozzle 33 (Step S2 in FIG. 3). As illustrated in FIG. 4A, the resist solution R supplied from the resist solution nozzle 33 diffuses on the wafer W resulting from the rotation of the wafer W. In this step S2, the supply amount of the resist solution R is set to be a small amount, and therefore the resist solution R does not diffuse to an end of the wafer W. Besides, the wafer W rotates at high speed at the first rotation number, but the resist solution R on the wafer W is not completely dried because the rotation of the wafer W at the first rotation number is performed for a short period of time of 0.8 seconds.

After that, the rotation of the wafer W is decelerated to, for example, 100 rpm to 500 rpm which is a second rotation number, 100 rpm in this embodiment as illustrated in FIG. 3, and thereafter the wafer W is rotated at the second rotation number for, for example, 0.4 seconds. During the decelerating rotation of the wafer W and to a middle of the rotation at the second rotation number, the resist solution R is continuously supplied from the resist solution nozzle 33. Namely, the supply of the resist solution R continuously performed from the step S2 is stopped (Step S3 in FIG. 3) after, for example, 0.2 seconds has passed since a rotation start of the wafer W at the second rotation number. In this step S3, the wafer W rotates at low-speed at the second rotation number, and therefore the resist solution R on the wafer W is smoothed and planarized because, for example, a force drawing to the central portion acts on the resist solution R at the outer peripheral portion of the wafer W.

After that, the rotation of the wafer W is accelerated to, for example, 1000 rpm to 2500 rpm which is a third rotation number, 1500 rpm in this embodiment, and thereafter the wafer W is rotated at the third rotation number for, for example, 2.5 seconds (Step S4 in FIG. 3). In this step S4, the resist solution R diffuses to the whole surface of the wafer W as illustrated in FIG. 4B, and reaches the end portion of the wafer W.

Subsequently, when the resist solution R reaches the end portion of the wafer W as illustrated in FIG. 4B, the rotation of the wafer W is decelerated to, for example, more than "0" (zero) rpm and 500 rpm or less which is a fourth rotation number, 100 rpm in this embodiment, and thereafter the wafer W is rotated at the fourth rotation number for, for example, 1 second to 10 seconds, 2 seconds in this embodiment (Step S5 in FIG. 3). It is possible to diffuse the resist solution R at the central portion of the wafer W toward the outer periphery of the substrate while suppressing drying of the resist solution R on the wafer W by rotating the wafer W at the fourth rotation number. Accordingly, it is possible to diffuse the resist solution R at the central portion of the wafer W toward the outer periphery of the wafer W even when the supply amount of the resist solution R is suppressed to a small amount compared to the conventional method. As a result, the resist solution R is uniformly coated within the surface of the wafer W without generating lowering of the film thickness at an outer peripheral edge portion of the wafer W.

After that, the rotation of the wafer W is accelerated to 800 rpm to 1800 rpm which is a fifth rotation number, 1500 rpm in this embodiment, and thereafter the wafer W is rotated at the fifth rotation number for, for example, 10 seconds (Step S6 in FIG. 3). In this step S6, the resist solution R diffused to the whole surface of the wafer W is dried as illustrated in FIG. 4C, and a resist film F is formed on the wafer W.

After that, a rear surface of the wafer W is washed, and a series of coating treatment in the resist coating apparatus 1 is finished.

Here, in the above-stated step S5, a verification is performed if it is possible to uniformly coat the resist solution R within the surface of the wafer W by diffusing the resist solution R at the central portion of the wafer W toward the outer periphery of the substrate while suppressing the drying of the resist solution R on the wafer W rotating at the fourth rotation number when the number of rotations of the wafer W is set to be more than "0" (zero) rpm and 500 rpm or less which is the fourth rotation number.

The inventors perform a comparative verification of how the film thicknesses of the resist solution R on the wafer W change between cases when the times rotating the wafer W at the fourth rotation number are changed from one second to five seconds, and a conventional method, namely a case when the time rotating at the third rotation number in the step S4 is set to be a time until the resist solution R is completely dried without rotating the wafer W at the fourth rotation number, to coat the resist solution R on the wafer W having the diameter of 300 mm. Note that the supply amount of the resist solution R is each set to be 0.25 ml in either case.

Figure 5:
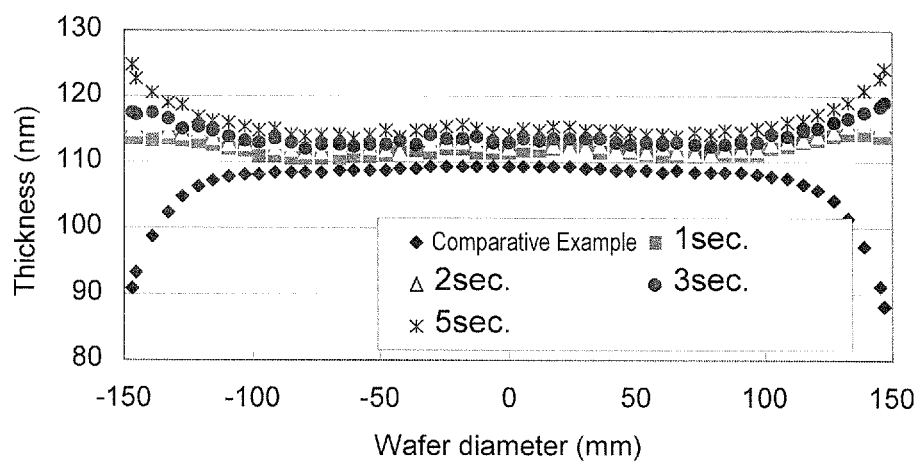
FIG. 5 is a graph illustrating a film thickness of the resist film on the wafer as for the present embodiment and a comparative example.

Results of this verification are represented in FIG. 5. A vertical axis in FIG. 5 represents the film thickness of the resist solution R, and a horizontal axis represents a measurement point of the film thickness of the resist solution R at the wafer W. At first, the result when the conventional method is used is described as a comparative example. When the resist solution R is coated by using the conventional method, the lowering of the film thickness of the resist solution R is recognized at the outer peripheral edge portion of the wafer W by referring to FIG. 5. Specifically, the film thickness is lowered at an area entering into a center side of the wafer W for approximately 30 mm from the end portion of the wafer W.

The inventors rotate the wafer W at the third rotation number after the resist solution R is supplied on the wafer W, and investigated as for a holding time at the fourth rotation number capable of coating the resist solution R without causing the lowering of the film thickness of the resist solution R at the outer peripheral edge portion of the wafer W by changing the times rotating at the fourth rotation number. It turned out that the lowering of the film thickness of the resist solution R at the outer peripheral edge portion of the wafer W does not occur in either cases when the holding times at the fourth rotation number are set at 1 second, 2 seconds, 3 seconds, and 5 seconds by referring to FIG. 5. Accordingly, it turned out that it is possible to diffuse the resist solution R at the central portion of the wafer W toward the outer periphery of the wafer W, and to uniformly coat the resist solution R within the surface of the wafer W by rotating the wafer W at the fourth rotation number for a predetermined time as in the present embodiment.

According to the above-stated embodiments, it is possible to uniformly diffuse the resist solution R even in the case when the supply amount of the resist solution R to the wafer W is small because at first, the resist solution R is supplied to the central portion of the wafer W while rotating the wafer W at the first rotation number in the step S2. After that, the wafer W is rotated at the second rotation number in the step S3, and therefore the coating solution supplied in the first step diffuses on the wafer W while suppressing the drying thereof. After that, in the step S4, the wafer W is rotated at the third rotation number which is faster than the second rotation number and slower than the first rotation number, and therefore the resist solution R on the wafer W is diffused to the whole surface of the wafer W. In the subsequent step S5, the wafer W is rotated at the fourth rotation number which is slower than the third rotation number, and therefore the resist solution R at the central portion of the wafer W is diffused to the outer periphery of the substrate while suppressing the drying of the resist solution R, and the resist solution R on the wafer W is smoothed and planarized. According to the coating treatment method of the present invention, it is possible to uniformly coat the resist solution R within the surface of the wafer W while suppressing the supply amount of the resist solution R to a small amount.

Note that the supply amount of the resist solution R required for coating the resist solution R without causing the lowering of the film thickness of the resist solution R at the outer peripheral edge portion of the wafer W is 0.25 ml when the coating treatment method of the present embodiment is used according to the investigation of the inventors. On the other hand, the required supply amount of the resist solution R is 0.5 ml when the above-stated conventional coating treatment method is used. It turned out that the supply amount of the resist solution R can be dramatically reduced according to the present embodiment.

Besides, the resist solution R is supplied on the wafer W in the step S3, and therefore fluidity of the resist solution R on the wafer W is able to be improved. It is thereby possible to smoothly diffuse the resist solution R to the end of the wafer W in the subsequent step S4.

Further, in the step S1, the prewetting by the solvent of the resist solution R is performed on the wafer W, and therefore it is possible to smoothly diffuse the resist solution R supplied on the wafer W in the subsequent steps.

Figure 6:
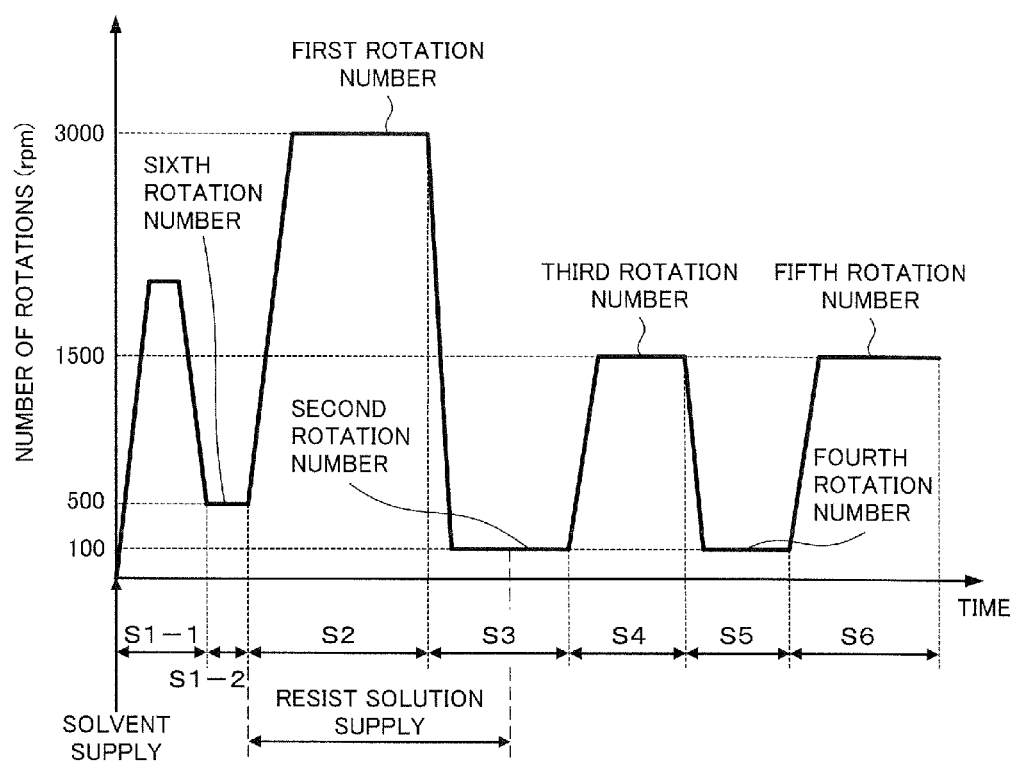
FIG. 6 is a graph illustrating the number of rotations of a wafer and supply timings of a resist solution and a solvent in each step of a coating treatment process according to another embodiment.

In the above-stated embodiment, the wafer W is rotated after the solvent is coated on the surface of the wafer W, then it is rotated at the number of rotations of, for example, 500 rpm as a sixth rotation number for a certain period of time, and thereafter the rotation of the wafer W is accelerated to the first rotation number in the first step. However, the wafer W may be accelerated to, for example, 2000 rpm after the solvent is coated as illustrated in FIG. 6, then it is rotated at the number of rotations of 2000 rpm for a certain period of time, for example, 0.3 seconds, and thereafter the rotation of the wafer W is decelerated to 500 rpm which is the sixth rotation number (Step S1-1 in FIG. 6), the rotation of the wafer W is held at 500 rpm for a certain period of time (Step S1-2 in FIG. 6), and thereafter the number of rotations of the wafer W may be increased to the first rotation number.

In such a case, the wafer W is rotated at 2000 rpm after the solvent is coated in the step S1-1, and therefore it is possible to diffuse the solvent on the wafer W within a short time compared to the case when it is rotated at 500 rpm. Accordingly, it is possible to shorten a required time for the step S1-1 and step S1-2 compared to a required time for the step S1.

Figure 7:
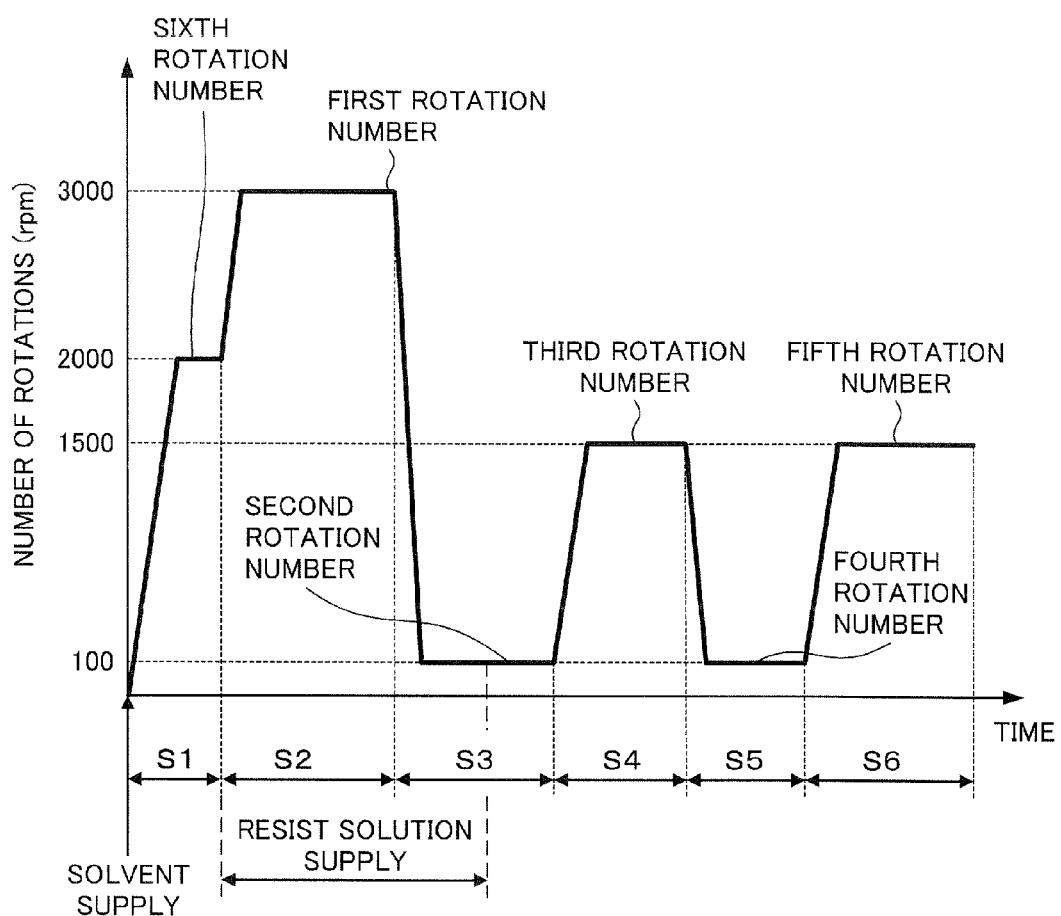
FIG. 7 is a graph illustrating the number of rotations of a wafer and supply timings of a resist solution and a solvent in each step of a coating treatment process according to still another embodiment.

Besides, when the coating of the solvent is performed while rotating the wafer W at the number of rotations of, for example, 2000 rpm in the step S1 as stated above, the step S2 may be started without decelerating the rotation of the wafer W, for example, as illustrated in FIG. 7, namely without performing the above-stated step S1-2. In such a case, the step S2 is started under a state in which the rotation of the wafer W is kept at, for example, 2000 rpm. Namely, in the present embodiment, this 2000 rpm becomes the sixth rotation number. After that, in the step S2, the rotation of the wafer W is accelerated to the first rotation number, and thereafter the wafer W is rotated at the first rotation number. Concurrently with the start of the step S2, the supply of the resist solution R from the resist solution nozzle 33 is started, and this supply of the resist solution R is continuously performed to a middle of the step S3. Note that the other steps S4, S5, S6 are the same as the above-stated embodiment, and therefore the description is not given.

In such a case, the solvent is coated on the surface of the wafer W in the step S1, and thereafter the step S2 is started without decelerating the rotation of the wafer W. Therefore, the rotation of the wafer W in the step S2 is kept at high speed compared to the above-stated embodiment. Accordingly, a relatively strong centrifugal force acts on the resist solution R on the wafer W, and the uniformity of the film thickness of the resist solution R within the wafer surface can further be improved. Besides, the required time for the step S1 can be shortened.

Figure 8:
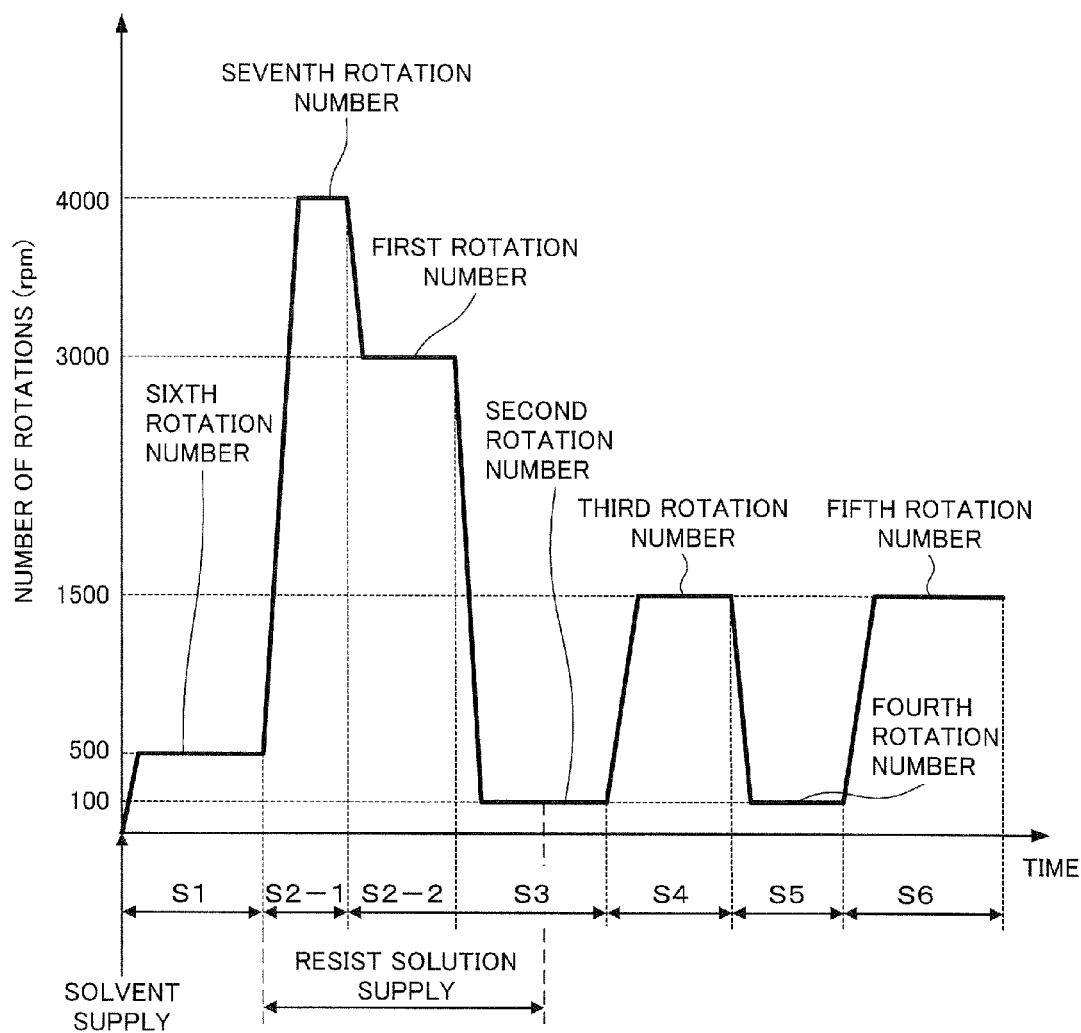
FIG. 8 is a graph illustrating the number of rotations of a wafer and supply timings of a resist solution and a solvent in each step of a coating treatment process according to yet another embodiment.

In the step S2 of the above-stated embodiment, the wafer W may be rotated at a seventh rotation number which is faster than the first rotation number before the wafer W is rotated at the first rotation number as illustrated in FIG. 8.

For example, after the step S1, the rotation of the wafer W is accelerated to, for example, 4000 rpm or less which is the seventh rotation number, 4000 rpm in the present embodiment, and thereafter the wafer W is rotated at the seventh rotation number. The rotation of the wafer W at the seventh rotation number is performed for 0.1 seconds to 0.5 seconds, 0.2 seconds in the present embodiment (Step S2-1 in FIG. 8). After that, the rotation of the wafer W is decelerated to the first rotation number, and thereafter the wafer W is rotated at the first rotation number for, for example, 0.6 seconds (Step S2-2 in FIG. 8). Note that the resist solution R is continuously supplied from the resist solution nozzle 33 to the central portion of the wafer W in the step S2-1 and the step S2-2. Besides, the other steps S1, S3, S4, S5, S6 are the same as the above-stated embodiment, and therefore the description is not given.

In such a case, the resist solution R is supplied on the wafer W while rotating the wafer W at high-speed at the seventh rotation number in the step S2-1, and therefore it is possible to diffuse the resist solution R more smoothly and uniformly. Accordingly, the supply amount of the resist solution R on the wafer W can be more reduced. Besides, it is described in the present embodiment as for the case when the required times for the step S2-1 and the step S2-2 are almost the same as the required time for the step S2 of the above-stated embodiment, but it is possible to shorten the required times for the step S2-1 and the step S2-2 because the resist solution R can be smoothly diffused as stated above. For example, it turned out by the investigation of the inventors that an effect capable of reducing the supply amount of the resist solution R as stated above can be fully obtained by performing the rotation of the wafer W at the seventh rotation number for 0.1 seconds to 0.5 seconds, and therefore it is possible to set the time rotating the wafer W at the seventh rotation number for 0.2 seconds or less.

Figure 9:
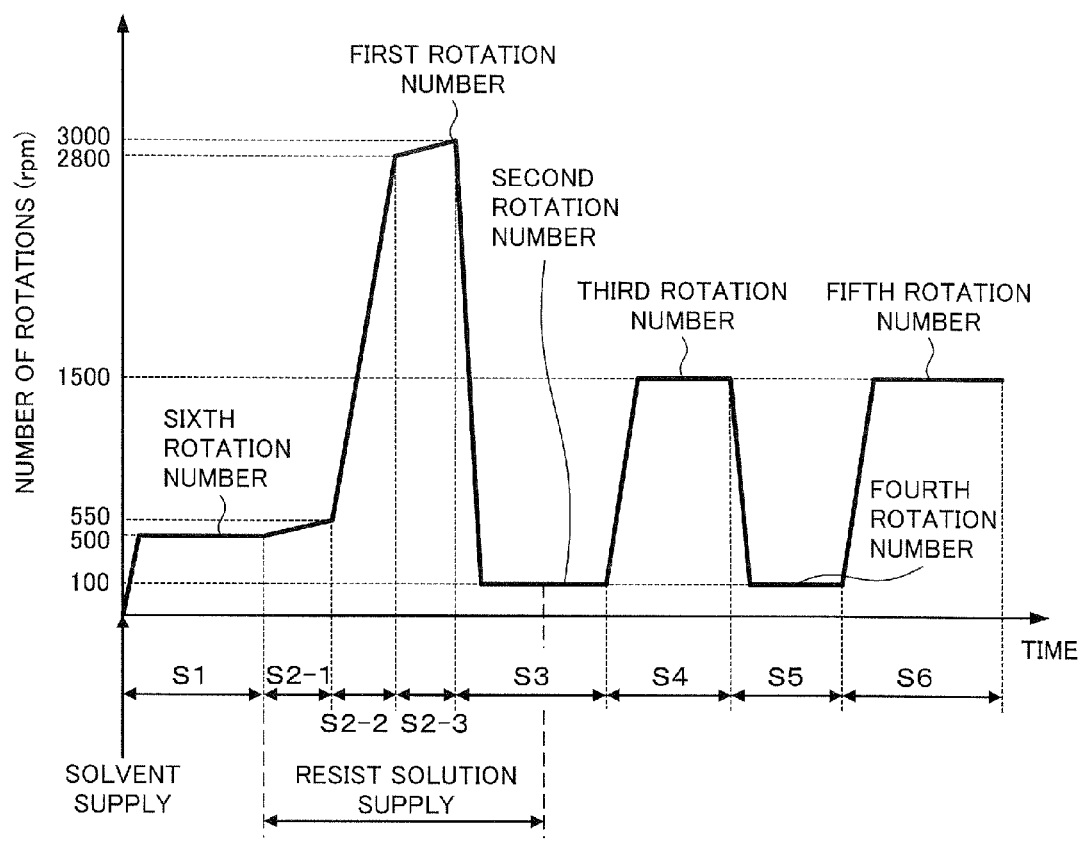
FIG. 9 is a graph illustrating the number of rotations of a wafer and supply timings of a resist solution and a solvent in each step of a coating treatment process according to another embodiment.

In the step S2 of the above-stated embodiment, the wafer W may be constantly rotated with acceleration as illustrated in FIG. 9. In the step S2, the rotation of the wafer W is accelerated from 500 rpm to, for example, 550 rpm (Step S2-1 in FIG. 9). In this step S2-1, an acceleration of the rotation of the wafer W is a first acceleration of, for example, 500 rpm/s or less, more preferably 100 rpm/s. As stated above, a rotation speed of the wafer W is low just after the resist solution R is discharged to the central portion of the wafer W, and therefore the strong centrifugal force is not applied to the resist solution R on the wafer W. In addition, the first acceleration of the rotation of the wafer W at this time is also small, and therefore the centrifugal force applied to the resist solution R on the wafer W can be suppressed. Accordingly, the resist solution R is uniformly diffused in an outer direction.

Subsequently, the rotation of the wafer W is accelerated from 550 rpm to, for example, 2800 rpm (Step S2-2 in FIG. 9). In this step S2-2, the acceleration of the rotation of the wafer W is a second acceleration of, for example, 5000 rpm/s to 30000 rpm/s, more preferably 10000 rpm/s which is larger than the first acceleration. As stated above, the wafer W is rotated with acceleration at the second acceleration which is larger than the first acceleration, and therefore the resist solution R on the wafer W can be smoothly and quickly diffused.

Next, the rotation of the wafer W is accelerated from 2800 rpm to the first rotation number (Step S2-3 in FIG. 9). In this step S2-3, the acceleration of the rotation of the wafer W is a third acceleration of, for example, 500 rpm/s or less, more preferably 100 rpm/s which is smaller than the second acceleration. Note that the other steps S1, S3, S4, S5, S6 are the same as the above-stated embodiment, and therefore the description is not given. As stated above, the wafer W is rotated with acceleration with the third acceleration which is smaller than the second acceleration, and therefore the resist solution R can be diffused smoothly on the wafer W. Accordingly, it is possible to uniformly coat the resist solution R within the surface of the wafer W.

Figure 10:
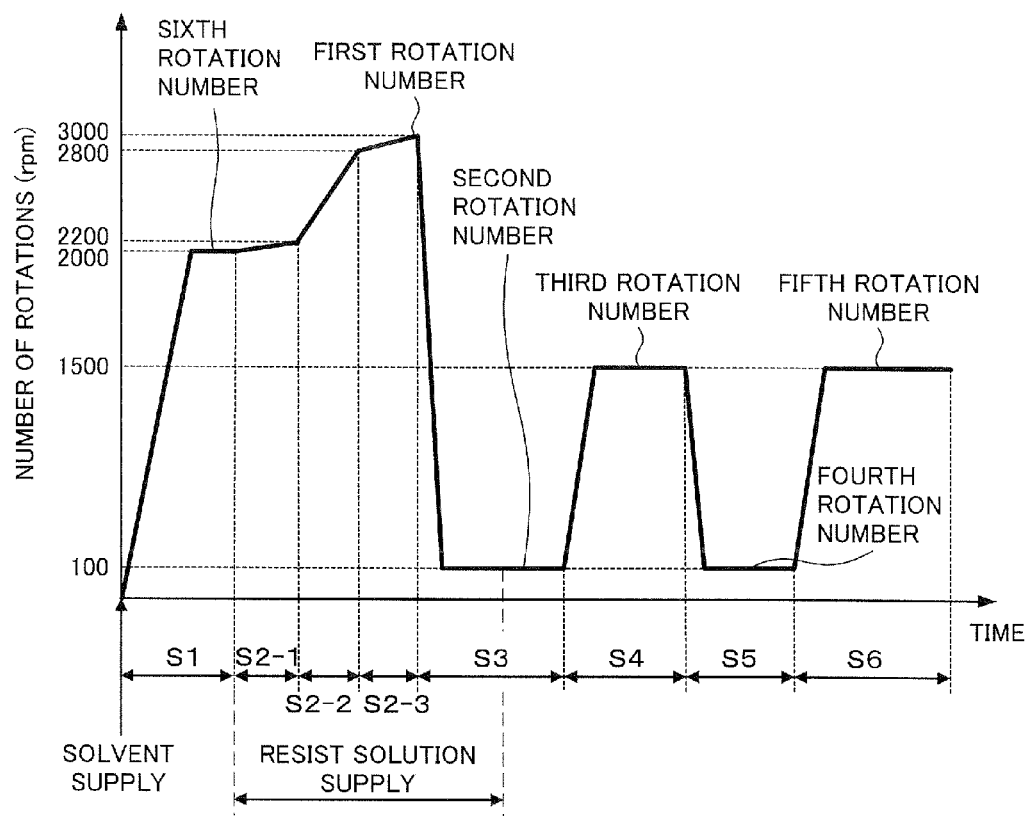
FIG. 10 is a graph illustrating the number of rotations of a wafer and supply timings of a resist solution and a solvent in each step of a coating treatment process according to another embodiment.

Note that the step S2 may be started without decelerating the rotation of the wafer W to, for example, 500 rpm in the step S1 as illustrated in FIG. 7 also in the present embodiment. Namely, the rotation of the wafer W is accelerated from 2000 rpm to, for example, 2200 rpm with the first acceleration in the step S2-1, subsequently the rotation of the wafer W is accelerated from 2200 rpm to, for example, 2800 rpm with the second acceleration in the step S2-2, and subsequently, the rotation of the wafer W is accelerated from 2800 rpm to the first rotation number with the third acceleration in the step S2-3 as illustrated in FIG. 10. It is possible also in the above-stated case to uniformly coat the resist solution R within the wafer surface while suppressing the supply amount of the resist solution R to a small amount as stated above.

Figure 11:
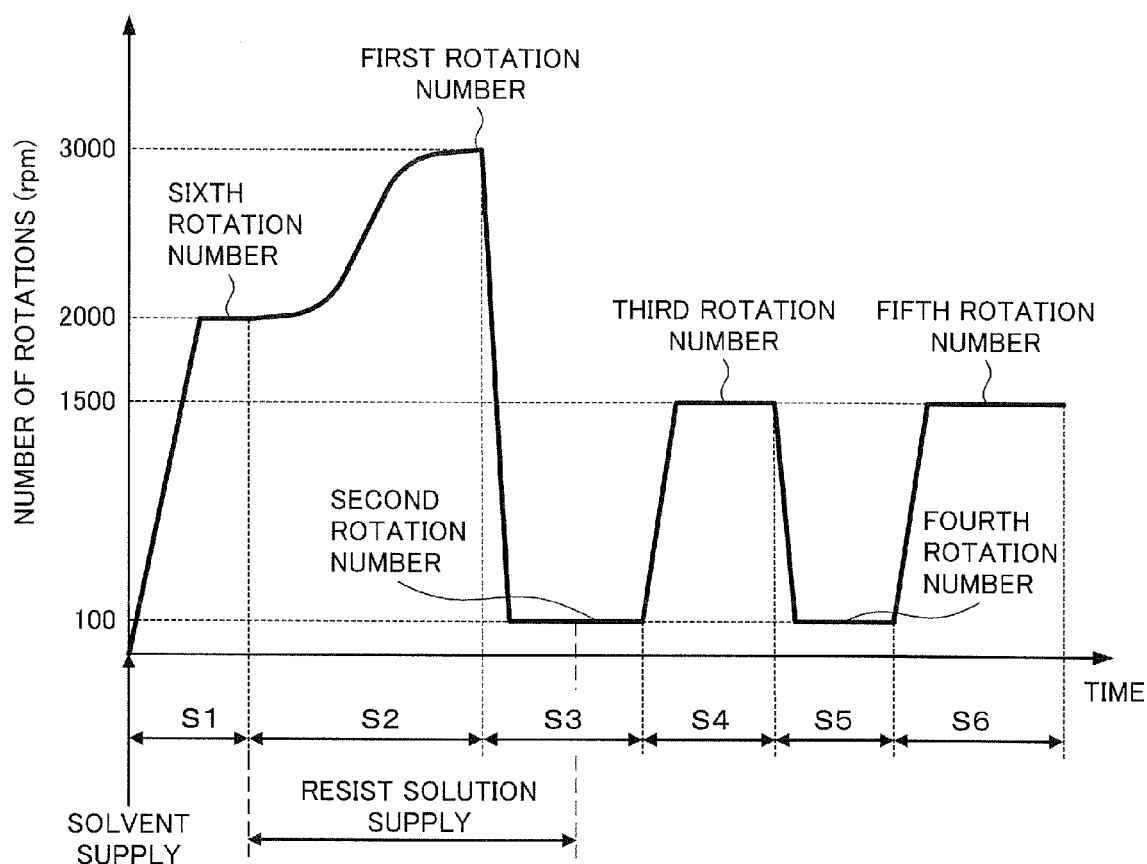
FIG. 11 is a graph illustrating the number of rotations of a wafer and supply timings of a resist solution and a solvent in each step of a coating treatment process according to another embodiment.

In the above-stated embodiment, the wafer W is constantly rotated with acceleration in the step S2, but the method of the accelerating rotation of the wafer W is not limited to the method illustrated in FIG. 9 and FIG. 10. For example, the wafer W may be rotated with acceleration such that the number of rotations of the wafer W is changed in S-shape from, for example, 2000 rpm to the first rotation number in the step S2 as illustrated in FIG. 11. Namely, the number of rotations of the wafer W which is at 2000 rpm before the step S2 is started is gradually accelerated so that the number of rotations thereof changes continuously and smoothly after that. At this time, the acceleration of the rotation of the wafer W increases little by little from, for example "0" (zero). The acceleration of the rotation of the wafer W decreases little by little at the completion time of the step S2, and the number of rotations of the wafer W smoothly converges to the first rotation number.

Figure 12:
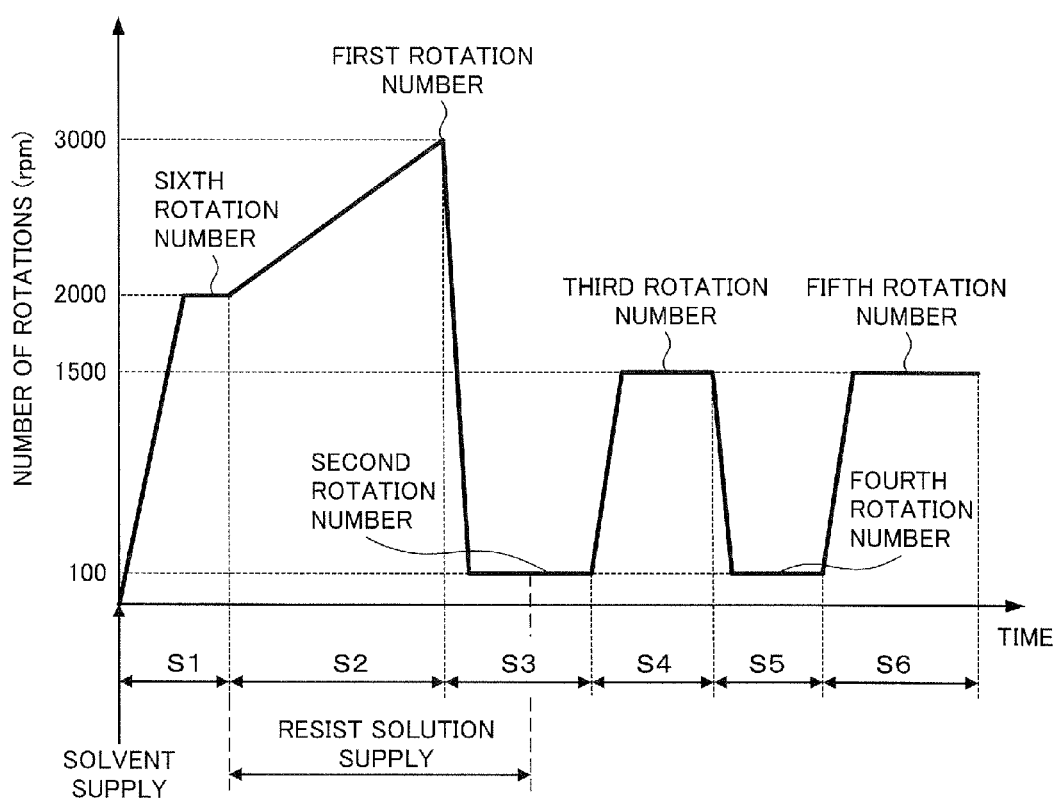
FIG. 12 is a graph illustrating the number of rotations of a wafer and supply timings of a resist solution and a solvent in each step of a coating treatment process according to another embodiment.

Besides, in the step S2, the wafer W may be rotated with acceleration such that the number of rotations of the wafer W is changed linearly from, for example, the sixth rotation number to the first rotation number as, for example, illustrated in FIG. 12. At this time, the acceleration of the rotation of the wafer W is constant.

As stated above, the rotation of the wafer W is constantly accelerated in the step S2 in either cases illustrated in FIG. 11 and FIG. 12, and therefore it is possible to uniformly coat the resist solution R within the wafer surface while suppressing the supply amount of the resist solution R to a small amount.

Figure 13:
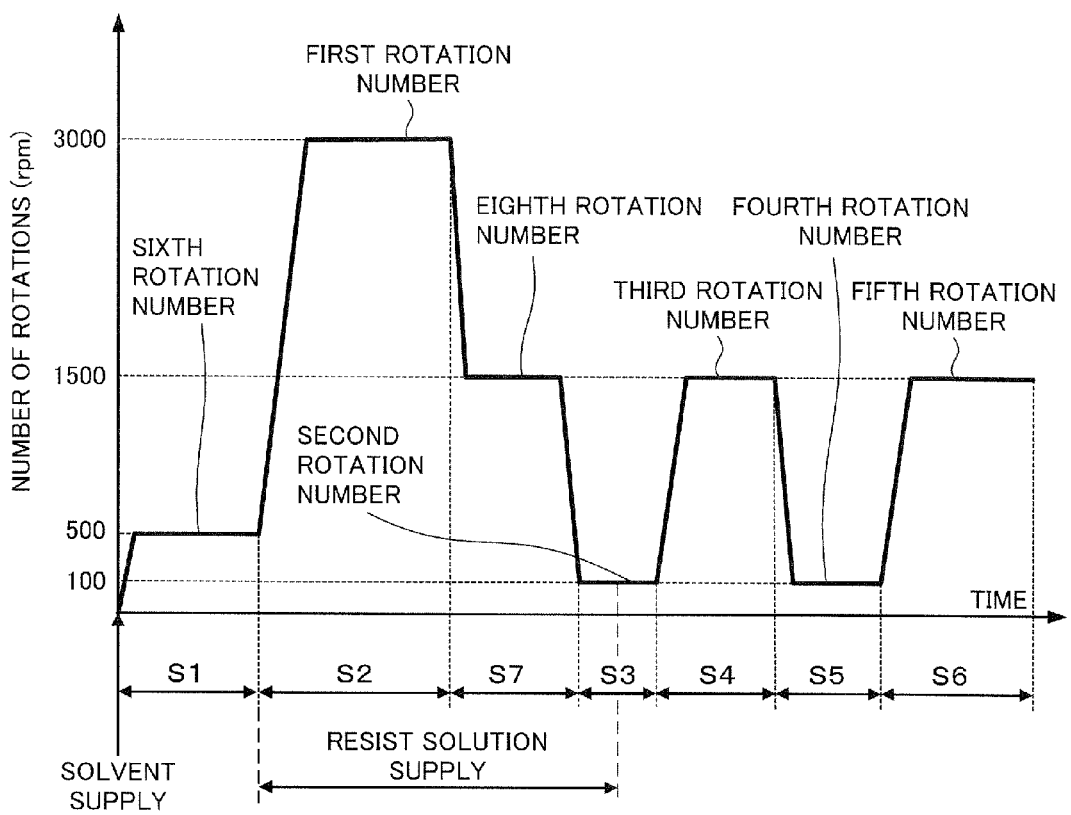
FIG. 13 is a graph illustrating the number of rotations of a wafer and supply timings of a resist solution and a solvent in each step of a coating treatment process according to another embodiment.

In the above-stated embodiment, the rotation of the wafer W is decelerated from the first rotation number to the second rotation number in the step S3, but step S7 in which the wafer W is rotated at, for example, 1500 rpm to 2000 rpm as a eighth rotation number which is slower than the first rotation number and faster than the second rotation number may be performed between the step S2 and the step S3 as, for example, illustrated in FIG. 13.

Figure 14:
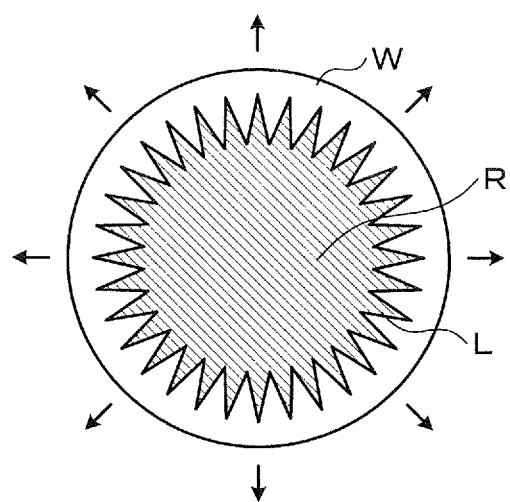
FIG. 14 is an explanatory view illustrating an appearance in which a resist solution diffuses on a wafer when a conventional coating treatment method is used.

According to the inventors, a contact angle of the resist solution R on the surface of the wafer W becomes large resulting from an effect of additives in the resist solution R in the step S2. Besides, the wafer W is rotated at high speed at the first rotation number, and therefore the resist solution R on the wafer W is dried and the fluidity at the surface of the resist solution R is lowered. Accordingly, the resist solution R supplied in advance on the wafer W in the first step is not mixed with the resist solution R supplied on the wafer W in the second step when the resist solution R is supplied to the wafer W rotating at low-speed at the second rotation number in the step S3 performed subsequently. In this case, it is verified that there is a case when sharp-pointed long coating patches L appear in a radial pattern when the resist solution R is diffused on the wafer W by rotating the wafer W at the third rotation number in the subsequent step S4, because the resist solution R irregularly diffuses in a streak state toward the outer direction of the wafer W as illustrated in FIG. 14.

The inventors studied hard as for this point, and as a result, it turned out that it is possible to diffuse the resist solution R on the wafer W while suppressing the drying of the resist solution R when the resist solution R is supplied to the wafer W rotating at 1500 rpm to 2000 rpm which is the eighth rotation number. Accordingly, it is possible to coat the resist solution R without generating the coating patch on the substrate because the resist solution R diffuses in a concentric state of the wafer W when the wafer W is rotated at the second rotation number.

In the present embodiment, the rotation of the wafer W is decelerated to, for example, 1500 rpm to 2000 rpm which is the eighth rotation number, 1500 rpm in the present embodiment after the wafer W is rotated at the first rotation number, and thereafter the wafer W is rotated at the eighth rotation number as illustrated in FIG. 13. The rotation of the wafer W at the eighth rotation number is performed for 0.4 seconds or more, 0.5 seconds in the present embodiment. The resist solution R is continuously supplied from the resist solution nozzle 33 during the decelerating rotation and the rotation at the eighth rotation number of the wafer W (Step S7 in FIG. 13). The supplied resist solution R diffuses on the wafer W resulting from the rotation of the wafer W. In this step S7, the number of rotations of the wafer W is decelerated to the eighth rotation number, and therefore the drying of the resist solution R on the wafer W can be suppressed. Accordingly, the resist solution R supplied in advance in the step S2 and the resist solution R supplied in the step S3 are easy to be mixed, and therefore the resist solution R diffuses in the concentric state of the wafer W. Note that in this step S7, the resist solution R diffuses to the outer peripheral portion of the wafer W, but the resist solution R does not diffuse to the end of the wafer W.

Besides, it turned out that the drying of the resist solution R on the wafer W can be fully suppressed when the rotation of the wafer W at the second rotation number is performed for 0.4 seconds or more by the investigation of the inventors.

Figure 15:
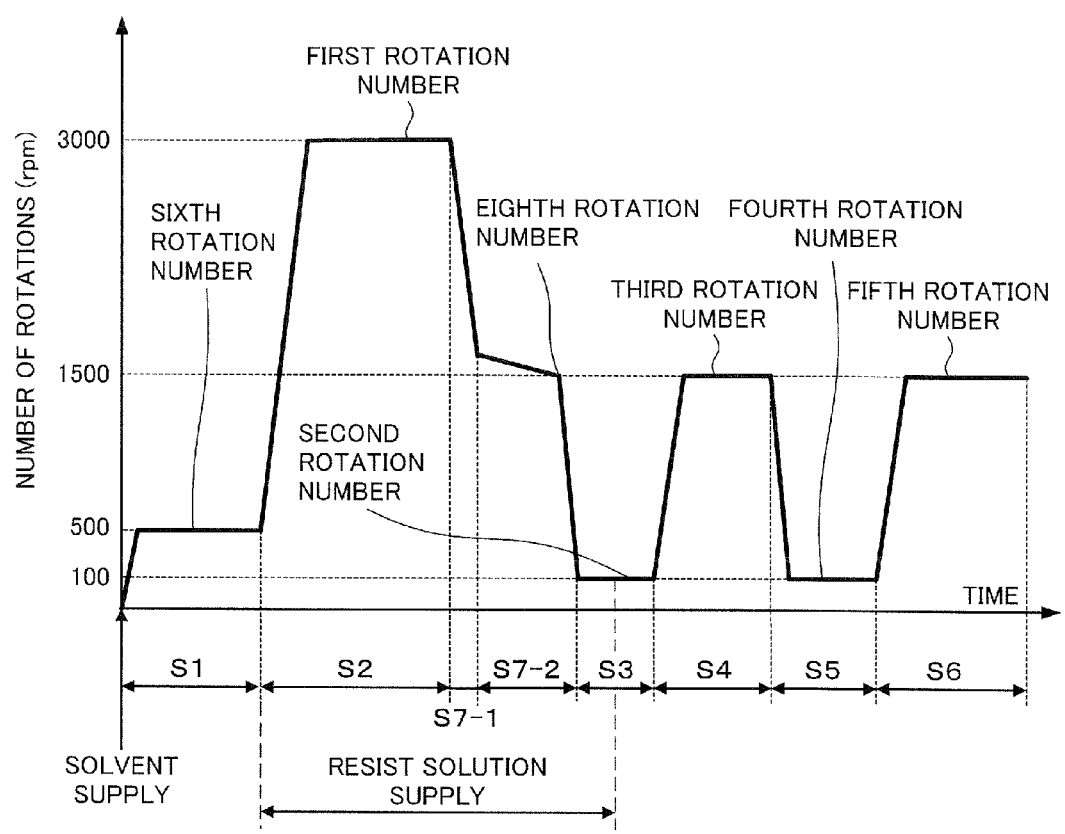
FIG. 15 is a graph illustrating the number of rotations of a wafer and supply timings of a resist solution and a solvent in each step of a coating treatment process according to another embodiment.

Note that in the step S7 of the above-stated embodiment, the wafer W may be constantly rotated with deceleration as illustrated in FIG. 15. In the step S7, the rotation of the wafer W is decelerated from the first rotation number to, for example, 1800 rpm (Step S7-1 in FIG. 15). In this step S7-1, the acceleration of the rotation of the wafer W is a fourth acceleration of, for example, (−30000 rpm/s) to (−5000 rpm/s), more preferably, (−10000 rpm/s). Subsequently, the rotation of the wafer W is decelerated from 1800 rpm to the eighth rotation number (Step S7-2 in FIG. 15). In this step S7-2, the acceleration of the rotation of the wafer W is a fifth acceleration of, for example, (−500 rpm/s) or more and less than zero rpm/s, more preferably (−100 rpm/s), which is larger than the fourth acceleration.

In such a case, the wafer W is rotated at the eighth rotation number in the step S7, and therefore the resist solution R supplied on the wafer W in the step S2 can be diffused while suppressing the drying thereof. The resist solution R supplied in the step S2 and the resist solution R supplied in the step S7 are easy to be mixed, and therefore the resist solution R can be diffused on the wafer W in the concentric state. Accordingly, it is possible to prevent the generation of the coating patch of the resist solution R and to uniformly coat the resist solution R within the wafer surface.

Figure 16:
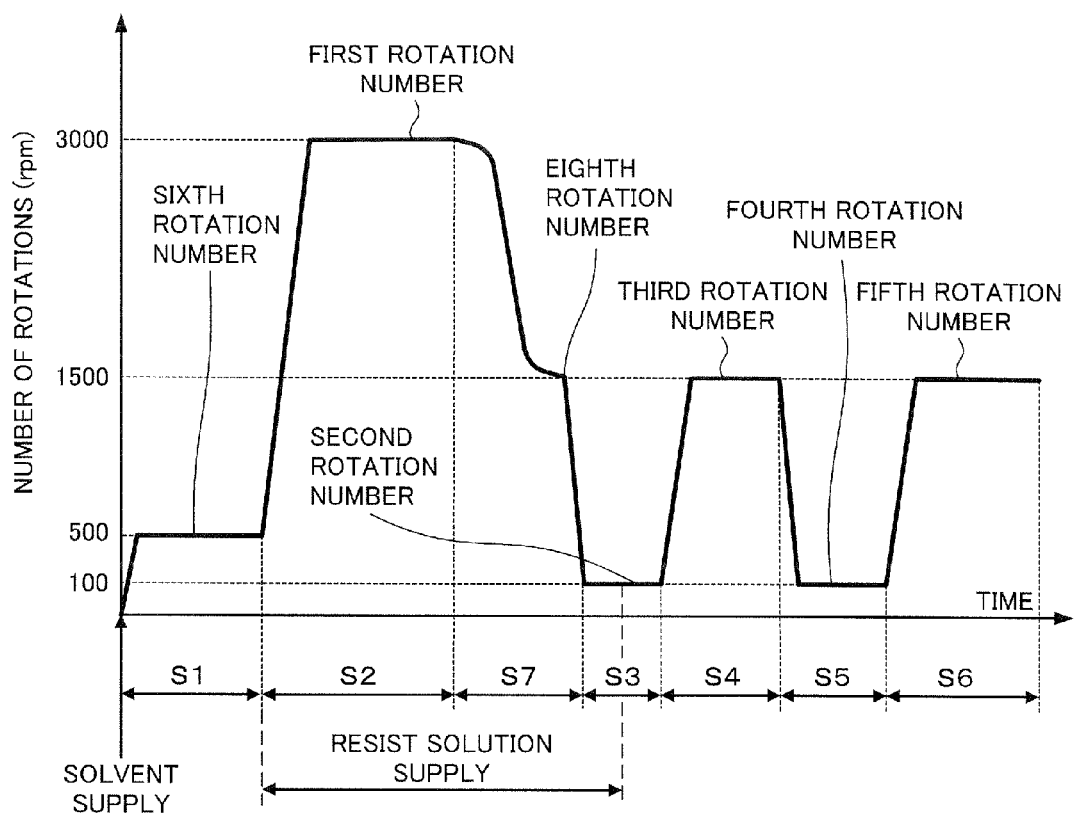
FIG. 16 is a graph illustrating the number of rotations of a wafer and supply timings of a resist solution and a solvent in each step of a coating treatment process according to another embodiment.

In the above-stated embodiment, the wafer W is constantly rotated with deceleration in the step S7, in which the method of the decelerating rotation of the wafer W is not limited to the method illustrated in FIG. 15. For example, in the step S7, the wafer W may be rotated with deceleration such that the number of rotations of the wafer W is changed in the S-shape from the first rotation number to the eighth rotation number as illustrated in FIG. 16. Namely, the rotation of the wafer W at the first rotation number is decelerated little by little such that the number of rotations thereof changes continuously and smoothly after that. At this time, the acceleration of the rotation of the wafer W decreases gradually from, for example, zero. The acceleration of the rotation of the wafer W increases gradually at the completion time of the step S7, and the number of rotations of the wafer W smoothly converges to the eighth rotation number.

Figure 17:
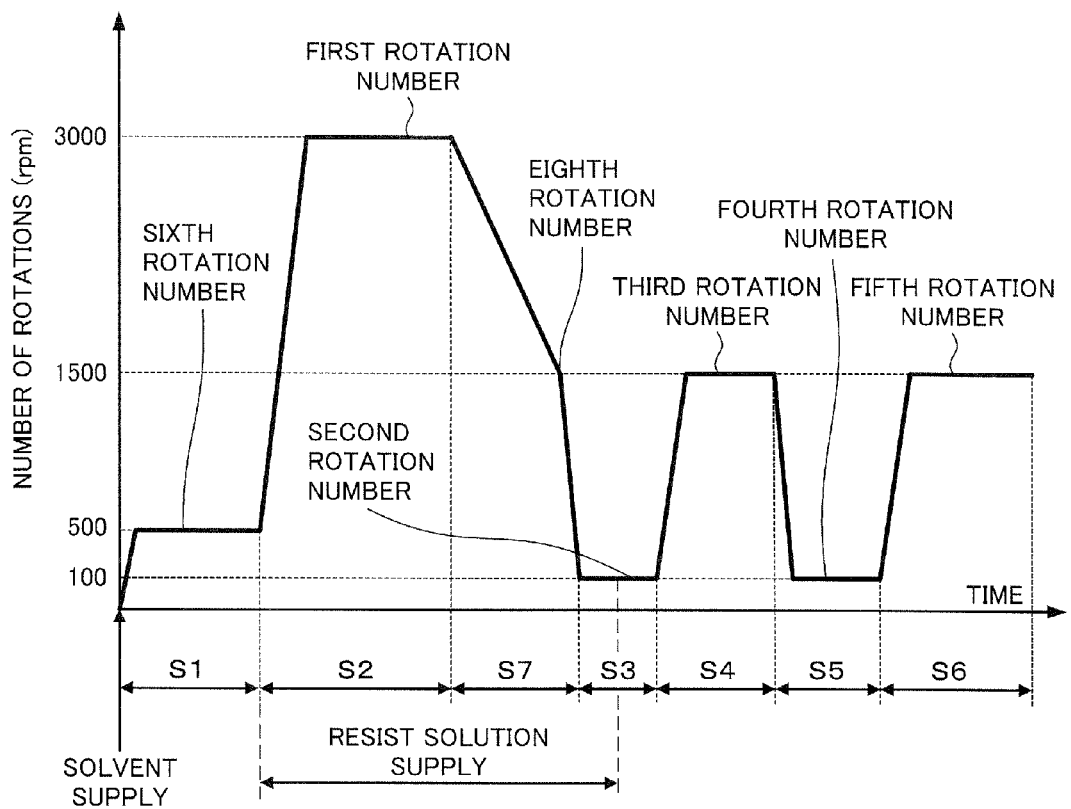
FIG. 17 is a graph illustrating the number of rotations of a wafer and supply timings of a resist solution and a solvent in each step of a coating treatment process according to the other embodiment.

Besides, for example, as illustrated in FIG. 17, the wafer W may be rotated with deceleration such that the number of rotations of the wafer W changes linearly from the first rotation number to the eighth rotation number in the step S7. At this time, the acceleration of the rotation of the wafer W is constant.

As stated above, the wafer W is rotated at the eighth rotation number in the step S7 in either cases illustrated in FIG. 16 and FIG. 17, and therefore it is possible to prevent the generation of the coating patches L of the resist solution R as stated above and to uniformly coat the resist solution R within the wafer surface.

Note that in the above-stated embodiment, the supply of the resist solution R is performed from the step S2 to the middle of the step S3, but the supply of the resist solution R may be stopped at the completion time of the step S2. The resist solution R on the wafer W is smoothed and planarized also in the case as stated above because it is possible to diffuse the resist solution R at the central portion of the wafer W to the outer periphery of the substrate while suppressing the drying of the resist solution R by rotating the wafer W at the fourth rotation number in the step S5.

A preferred embodiment of the present invention has been described above with reference to the accompanying drawings, but the present invention is not limited to the embodiment. It should be understood that various changes and modifications are readily apparent to those skilled in the art within the spirit as set forth in claims, and those should also be covered by the technical scope of the present invention. The present invention is not limited to this example but can take various forms. For example, in the above-stated embodiment, the coating treatment of the resist solution is described as an example, but the present invention is applicable for a coating treatments of coating solutions other than the resist solution, for example, coating solutions forming an anti-reflection film, an SOG (Spin On Glass) film, and an SOD (Spin On Dielectric) film, and so on. Besides, the above-stated embodiment is an example performing the coating treatment on the wafer, but the present invention is applicable for a case when the substrate is other substrates such as an FPD (Flat Panel Display), a mask reticule for a photomask other than the wafer.

What is claimed is:

1. A coating treatment method coating a coating solution onto a substrate, comprising:
    a first step of rotating the substrate at a first rotation number;
    a second step of subsequently decelerating the rotation of the substrate, and rotating the substrate at a second rotation number which is slower than the first rotation number, before the coating solution diffuses to an end of the substrate;
    a third step of subsequently accelerating the rotation of the substrate, and rotating the substrate at a third rotation number which is faster than the second rotation number and slower than the first rotation number;
    a fourth step of subsequently decelerating the rotation of the substrate, and rotating the substrate at a fourth rotation number which is slower than the third rotation number to diffuse the coating solution at a central portion of the substrate toward an outer periphery of the substrate while suppressing drying of the coating solution on the substrate;
    a fifth step of subsequently accelerating the rotation of the substrate, and rotating the substrate at a fifth rotation number which is faster than the fourth rotation number,
    wherein a supply of the coating solution to the central portion of the substrate is continuously performed from said first step to a middle of said second step or during said first step, and the fourth rotation number is more than "0" (zero) rpm and 500 rpm or less; and
    a seventh step of rotating the substrate at an eighth rotation number which is slower than the first rotation number and faster than the second rotation number between said first step and said second step,
    wherein the eighth rotation number is 1500 rpm to 2000 rpm.

2. The coating treatment method according to claim 1, wherein in said fourth step, the rotation of the substrate at the fourth rotation number is performed for one second to ten seconds.

3. The coating treatment method according to claim 1, further comprising:
    a sixth step of rotating the substrate at a sixth rotation number which is slower than the first rotation number before said first step.

4. The coating treatment method according to claim 3, wherein in said first step, an acceleration of the rotation of the substrate is changed in a sequence of a first acceleration, a second acceleration which is larger than the first acceleration, and a third acceleration which is smaller than the second acceleration, and the substrate is rotated with acceleration from the sixth rotation number to the first rotation number.

5. The coating treatment method according to claim 3, wherein in said first step, the rotation of the substrate which is at the sixth rotation number before starting is gradually accelerated such that the number of rotations changes continuously after the starting, and the acceleration of the rotation of the substrate is gradually decreased to make the rotation of the substrate converge to the first rotation number at a completion time.

6. The coating treatment method according to claim 3, wherein in said first step, the acceleration of the rotation of the substrate is made constant, and the substrate is rotated with acceleration from the sixth rotation number to the first rotation number.

7. The coating treatment method according to any one of claim 3, wherein a solvent is coated on the substrate while rotating the substrate at the number of rotations which is faster than the sixth rotation number before said sixth step.

8. The coating treatment method according to any one of claim 3, wherein in said sixth step, the solvent is coated on the substrate while rotating the substrate at the sixth rotation number.

9. The coating treatment method according to any one of claim 1, wherein in said first step, the substrate is rotated at a seventh rotation number which is faster than the first rotation number before the substrate is rotated at the first rotation number.

10. The coating treatment method according to claim 9, wherein the seventh rotation number is 4000 rpm or less, and in said first step, the rotation of the substrate at the seventh rotation number is performed for 0.1 seconds to 0.5 seconds.

11. The coating treatment method according to claim 1, wherein in said seventh step, the acceleration of the rotation of the substrate is changed in a sequence of a fourth acceleration and a fifth acceleration which is larger than the fourth acceleration, and the substrate is rotated with deceleration from the first rotation number to the eighth rotation number.

12. The coating treatment method according to claim 1, wherein in said seventh step, the rotation of the substrate which is at the first rotation number before starting is gradually decelerated such that the number of rotations thereof changes continuously after the starting, and the acceleration of the rotation of the substrate is gradually increased to make the rotation of the substrate converge to the eighth rotation number at the completion time.

13. The coating treatment method according to claim 1, wherein in said seventh step, the acceleration of the rotation of the substrate is made constant, and the substrate is rotated with deceleration from the first rotation number to the eighth rotation number.

14. A non-transitory computer readable storage medium storing a computer program operating on a computer at a control unit controlling a coating treatment apparatus to execute a coating treatment method at the coating treatment apparatus,
wherein the coating treatment method includes:
a first step of rotating a substrate at a first rotation number;
a second step of subsequently decelerating the rotation of the substrate, and rotating the substrate at a second rotation number which is slower than the first rotation number, before the coating solution diffuses to an end of the substrate;
a third step of subsequently accelerating the rotation of the substrate, and rotating the substrate at a third rotation number which is faster than the second rotation number and slower than the first rotation number;
a fourth step of subsequently decelerating the rotation of the substrate, and rotating the substrate at a fourth rotation number which is slower than the third rotation number to diffuse the coating solution at a central portion of the substrate toward an outer periphery of the substrate while suppressing drying of the coating solution on the substrate;
a fifth step of subsequently accelerating the rotation of the substrate, and rotating the substrate at a fifth rotation number which is faster than the fourth rotation number,
wherein a supply of a coating solution to a central portion of the substrate is continuously performed from the first step to a middle of the second step or during the first step, and the fourth rotation number is more than "0" (zero) rpm and 500 rpm or less; and
a seventh step of rotating the substrate at an eighth rotation number which is slower than the first rotation number and faster than the second rotation number between said first step and said second step,
wherein the eighth rotation number is 1500 m to 2000 rpm.

* * * * *